US006607633B2

(12) United States Patent
Noguchi

(10) Patent No.: US 6,607,633 B2
(45) Date of Patent: Aug. 19, 2003

(54) PLASMA GENERATING DEVICE AND PLASMA PROCESSING APPARATUS COMPRISING SUCH A DEVICE

(75) Inventor: Takeshi Noguchi, Kunitachi (JP)

(73) Assignee: Y.A.C. Co, Ltd., Tokyo (JP)

( * ) Notice: Subject to any disclaimer, the term of this patent is extended or adjusted under 35 U.S.C. 154(b) by 122 days.

(21) Appl. No.: 09/764,371

(22) Filed: Jan. 19, 2001

(65) Prior Publication Data

US 2002/0121344 A1 Sep. 5, 2002

(30) Foreign Application Priority Data

Jan. 20, 2000 (JP) ........................................ 2000-012269

(51) Int. Cl.[7] ........................... H05H 1/00; C23C 16/00; H01J 21/00
(52) U.S. Cl. ............................. 156/345.41; 156/345.36; 118/723 MW; 118/723 ME; 315/111.21
(58) Field of Search ................. 156/345.41, 345.36, 156/345.42; 118/723 MW, 723 ME, 723 MR, 723 MA, 723 AN; 315/111.21

(56) References Cited

U.S. PATENT DOCUMENTS

| 4,776,918 A | | 10/1988 | Otsubo et al. |
| 4,893,584 A | * | 1/1990 | Doehler et al. ........ 118/723 MW |
| 4,985,109 A | | 1/1991 | Otsubo et al. |
| 5,021,114 A | * | 6/1991 | Saito et al. ............ 156/345.42 |
| 5,034,086 A | | 7/1991 | Sato |
| 5,134,965 A | | 8/1992 | Tokuda et al. |
| 5,370,765 A | | 12/1994 | Dandl |
| 5,510,088 A | * | 4/1996 | Aklufi .................. 422/186.05 |
| 5,587,205 A | | 12/1996 | Saito et al. |
| 5,707,452 A | | 1/1998 | Dandl |
| 5,803,975 A | | 9/1998 | Suzuki |
| 5,861,601 A | | 1/1999 | Sato et al. |
| 5,902,404 A | | 5/1999 | Fong et al. |
| 5,911,852 A | * | 6/1999 | Katayama et al. ...... 156/345.41 |
| 5,975,014 A | | 11/1999 | Dandl |
| 5,976,257 A | | 11/1999 | Kanai et al. |
| 6,059,922 A | | 5/2000 | Yamazaki et al. |
| 6,186,090 B1 | * | 2/2001 | Dotter, II et al. ........... 118/718 |
| 6,189,481 B1 | * | 2/2001 | Akimoto ............. 118/723 MW |

FOREIGN PATENT DOCUMENTS

| JP | 62-58632 A | * | 3/1987 | ......... H01L/21/302 |
| JP | 1-222055 A | * | 9/1989 | ........... C23C/16/50 |
| JP | 8-124899 A | * | 5/1996 | ....... H01L/21/3065 |

* cited by examiner

Primary Examiner—Parviz Hassanzadeh
(74) Attorney, Agent, or Firm—Burns, Doane, Swecker & Mathis L.L.P.

(57) ABSTRACT

The present invention describes a plasma generating device comprising a wave guide; a radiative part having slot antennas, each of said slot antennas being adapted to radiate electromagnetic radiation; and a plasma generation chamber being connected to the radiative part via a window made of a dielectric material and being adapted to receive the electromagnetic radiation from the slot antennas; wherein the dimensions of the radiative part are locally modified or are locally changeable, so that the actual wavelength of the microwave is allowed to be locally changed, thereby the amplitude distribution of the electromagnetic radiation towards the plasma generation chamber can be controlled. The present invention also describes a plasma processing apparatus including such a plasma generating device.

15 Claims, 8 Drawing Sheets

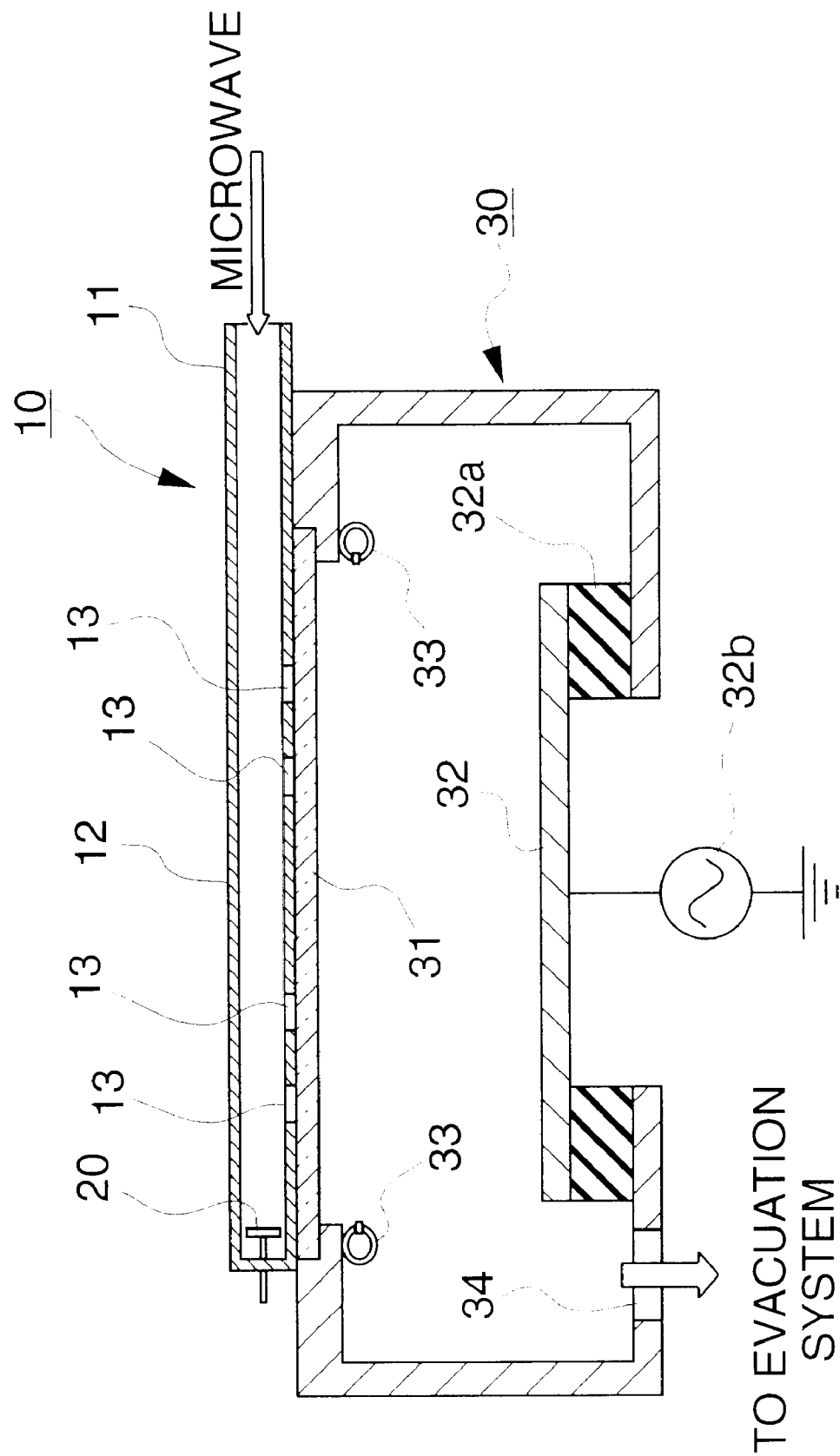

PLASMA GENERATING DEVICE AND PLASMA PROCESSING APPARATUS COMPRISING SUCH A DEVICE

This application claims priority under 35 U.S.C. §§119 and/or 365 to 2000-012269 filed in Japan on Jan. 20, 2000; the entire content of which is hereby incorporated by reference.

BACKGROUND OF THE INVENTION

1. Field of the Invention

The present invention relates to a device for generating a plasma, in the manufacturing process of semiconductor devices or liquid crystal displays, or in any other microelectronic process, which is used for performing various processes such as, for example, etching, ashing, deposition, surface modification, and surface cleaning.

The present invention also relates to a plasma processing apparatus comprising such a device.

This application is based on Japanese Patent Application No. 2000-12269, the contents of which are incorporated herein by reference.

2. State of the Related Art

In the manufacturing process of semiconductor devices or liquid crystal displays, or in any other microelectronic process, a variety of plasma processes are widely used in order to perform various processes such as, for example, etching, ashing, deposition, surface modification, and surface cleaning. Such a plasma process includes steps of generating a plasma in a vacuum and applying the plasma to a substrate.

For generating a plasma discharge, various principles are known to those skilled in the art. Particularly, it is well known to generate a plasma by using a radiant field from a slot antenna in a microwave band. This plasma generating method has an advantage that it can very easily generate a plasma at high density. In particular, a plasma discharge generated by a slot antenna using an alternating electromagnetic field in the microwave band is now attracting attention, since it has a large uniformity in plasma density distribution because its generating principle is based on a surface wave excitation.

In this case, as shown in FIG. 1A, even if a plasma distribution at a plasma generating area is uniform, it will become non-uniform at the neighborhood of a wafer located under the generating area due to lateral diffusion of constituting species of the plasma.

Therefore, in order to obtain a uniform plasma distribution at the neighborhood of the wafer, as shown in FIG. 1B, it is required that a plasma distribution at the plasma generating area be a so-called "raised-shoulder" shape, that is, the shape in which the plasma density at each edge portion is larger than that at a central portion.

Thus, in the case of a plasma generation using slot antennas, when it is desired to obtain the raised-shoulder shape plasma distribution above, one may locate slot antennas at a distribution corresponding to the desired distribution of the plasma density. That is, one may try to control the initial plasma distribution by setting the distribution of slot antennas.

In principle, slot antennas are located at any distribution. But, practically, the positioning of slot antennas is restricted due to the following reason:

Even if a slot antenna were located where the amplitude of a microwave propagating within a wave guide is small, the strength of the electromagnetic field radiated from the slot antenna will be weak. On the contrary, from a slot antenna located where the amplitude of a microwave is large, a strong electromagnetic field will be radiated. Therefore, in order to obtain a high density plasma by maximizing the plasma generation efficiency, a slot antenna must be located where the amplitude of a microwave is relatively large. Typically, in the case of a standing wave, the highest amplitude spots are regularly and discretely formed at intervals of half of the wavelength. Slot antennas can then be located at only such highest amplitude spots. Thus, it is practically impossible to control the initial distribution of a plasma by designing the distribution of slot antennas.

SUMMARY OF THE INVENTION

Taking the above circumstances into consideration, it is one object of the present invention to provide a plasma generating device in which the degree of freedom to position slot antennas is increased, while the initial plasma distribution, i.e. the plasma distribution in the area where the plasma is just generated, can be controlled as desired.

It is another object of the present invention to provide a plasma processing apparatus comprising such a plasma generating device.

To this end, the present invention proposes a plasma generating device comprising a wave guide for propagation of a microwave from a microwave oscillating source; a radiative part being connected to the wave guide for receiving the microwave therefrom and having slot antennas, each of the slot antennas being adapted to radiate electromagnetic radiation corresponding to the microwave existing at respective locations of slot antennas; and a plasma generation chamber being connected to the radiative part via a window made of a dielectric material and being adapted to receive the electromagnetic radiation from the slot antennas; wherein one or more dimensions of the radiative part is/are locally modified or is/are locally changeable, so that the actual wavelength within the radiative part is allowed to be locally changed, thereby the amplitude distribution of the electromagnetic radiation being radiated from the slot antennas towards the plasma generation chamber can be controlled.

Preferably, the frequency of the microwave may be in the range of between 1 GHz and 50 GHz.

Preferably, each slot antenna defines a slot, and the total edge length of each slot may be substantially equal to the ideal wavelength of the microwave in free space.

Preferably, each slot may be disposed with its longitudinal direction being oriented at a right angle or at any angle other than a right angle with respect to the propagation direction of the microwave within the radiative part.

Preferably, either the height or the width of the radiative part may be changeable. Particularly, either the height or the width of the radiative part may be gradually changed. More particularly, the changing rate thereof may be changeable.

Preferably, the shape of the radiative part may be rectangular, and the width of the radiative part near the slot antennas may be changeable. Particularly, the width of the rectangular radiative part near the slot antennas may be gradually changed. More particularly, the changing rate thereof may be changeable.

Practically, a plunger made of an electrically conductive plate may be provided at the end of the radiative part so as to be slidable with respect to the propagation direction of the microwave within the radiative part. In use, the electric potential of the plunger may be maintained to be equal to the electric potential of the radiative part.

If desired, a plurality of radiative parts may be connected to the wave guide. In this case, preferably, a plurality of plungers is provided at each end of the plurality of radiative parts so as to be slidable with respect to the propagation direction of the microwave within the respective radiative part. In use, similarly, the electric potential of each plunger may be maintained to be equal to the electric potential of the respective radiative part.

The present invention also proposes a plasma processing apparatus, this apparatus is characterized by comprising the above plasma generating device.

Preferably, in the plasma processing apparatus, a support for an article to be processed may be provided in the plasma generating chamber with one surface of the support opposite to the window. AC voltage or DC voltage may be applied to the support.

Preferably, the support is provided with a mechanism for controlling the temperature of the article to be processed.

We will now explain the basic principle of the present invention.

The present invention is based on the fact that the actual wavelength within a wave guide varies depending on the dimensions of the wave guide. Assuming that the wave guide used is a rectangular wave guide as shown in FIG. 2A, the actual wavelength within this type of wave guide at the $TE_{01}$ mode is given the following equation:

$$\lambda g = \frac{\lambda}{[1-(\lambda/2a)^2]^{1/2}}$$

wherein $\lambda_g$ is the actual wavelength at which the wave propagates within the wave guide; $\lambda$ is the ideal wavelength at which the wave propagates in free space; and (a) is the width of the rectangular wave guide.

Thus, the actual wavelength $\lambda_g$ varies as a function of the width (a) of the wave guide (see FIG. 2B).

As is easily understood, not only in the case of a rectangular type of wave guide, but also in the case of any shape wave guide, the actual wavelength can be altered by changing one or more local dimensions of the wave guide. By altering the actual wavelength as such, the position of the highest amplitude spots can be shifted as desired within the wave guide.

Therefore, the particularly preferable designing method according to the present invention has the steps of:
(i) determining the ideal initial plasma distribution (for example, the raised-shoulder shape plasma distribution as shown in FIG. 1B) which will cause uniform plasma distribution at the neighborhood of a wafer;
(ii) positioning slot antennas at the distribution corresponding to said initial plasma distribution determined above; and
(iii) locally and appropriately changing one or more dimensions of a wave guide (changing of one or more dimensions may be either variable type or non-variable type) around which slot antennas is to be located depending on said distribution of antennas.

Thus, the actual wavelength can be locally altered so that the positions of the highest amplitudes can be shifted to the positions at which slot antennas are located, thereby the desired initial plasma distribution is obtained. In this case, it is noted that high density plasma is obtained with maximized plasma generating efficiency.

Accordingly, in the present invention, irrespective of conventional restriction that slot antennas must be located at an interval of half of a wavelength, even if slot antennas are located at any distribution, each slot antenna is allowed to radiate electromagnetic waves with the substantially highest radiation efficiency. That is, in the present invention, a desired initial plasma distribution is obtained by optionally setting the distribution of slot antennas.

In the above, the description is made for allowing all slot antennas to radiate electromagnetic waves with the highest radiation efficiency. However, if desired, the radiation efficiency from specific slot antennas may be "intentionally" reduced in order that the plasma distribution actually formed becomes as close as possible to the desired initial plasma distribution. The principal goal of the present invention is obtaining the initial plasma distribution which will cause uniform plasma distribution near the wafer, rather than maximizing the radiation efficiency from all slot antennas.

BRIEF DESCRIPTION OF THE DRAWINGS

FIG. 3 is a cross-sectional view showing the plasma processing apparatus according to the first embodiment of the present invention.

DETAILED DESCRIPTION OF THE PREFERRED EMBODIMENTS

Figure 1A:
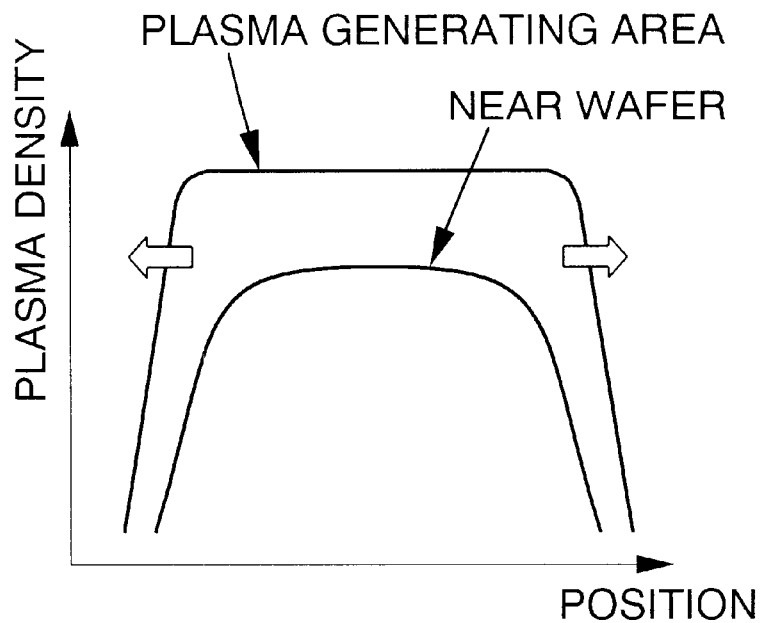
FIGS. 1A and 1B are views showing the relationship between the initial plasma distribution in the area where the plasma is just generated in a plasma generating chamber and the plasma distribution near a wafer to be processed.

Next, we will explain the non-limiting embodiments of the present invention with reference to the appended drawings.

[First Embodiment of the Plasma Processing Apparatus]

Firstly, FIG. 3 illustrates the plasma processing apparatus according to the first embodiment proposed by the present invention. In FIG. 3, the plasma processing apparatus includes a plasma generating device 10.

The plasma generating device 10 comprises a microwave oscillator (not shown), a wave guide 11, a radiative part 12, and a plasma generating chamber 30.

In this embodiment, the oscillating frequency of the microwave oscillator (not shown) is in the range of between 1 GHz and 50 GHz, preferably, 2.45 GHz.

The wave guide 11 is provided for propagation of a microwave from the microwave oscillator. The wave guide 11 may be a rectangular wave guide, a circular wave guide, or any shape of wave guide. In this embodiment, the wave guide 11 is preferably a rectangular wave guide.

The radiative part 12 is a wave guide which is connected to the wave guide 11. The radiative part 12 may be a rectangular wave guide, a circular wave guide, or any shape of wave guide. In this embodiment, the radiative part 12 is preferably a rectangular wave guide.

In the radiative part 12, a plurality of slot antennas 13 (in the example illustrated, four-slot antenna 13) are formed. Each of the slot antennas 13 defines a slot. Preferably, the total edge length of each slot is substantially equal to the ideal wavelength of the microwave in free space. Preferably, each slot is disposed with its longitudinal direction being oriented at a right angle with respect to the propagation direction of the microwave within the radiative part 12. However, alternatively, each slot may be disposed with its longitudinal direction being oriented at a predetermined angle other than a right angle with respect to the propagation direction of the microwave within the radiative part 12.

Next, with reference to FIGS. 4A–4E, the constructions of the radiative part 12 will be described more specifically. FIGS. 4A–4E are cross-sectional views showing several alternative constructions for the radiative part 12. These figures show the construction from the underside, i.e., from the side of the plasma generating chamber 30 in FIG. 3. These figures diagrammatically illustrate the positions of the slot antennas 13 and the respective wall structures of the radiative parts 12.

Figure 4A:
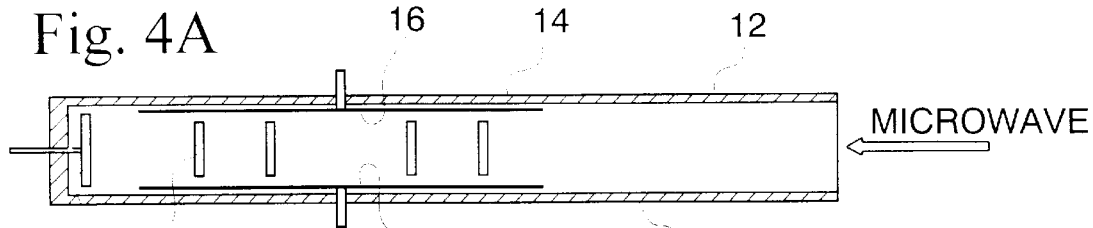
FIGS. 4A–4E are cross-sectional views showing several alternative constructions for the radiative part used in the plasma processing apparatus shown in FIG. 3.

In the example shown in FIG. 4A, movable plates 16 are provided on sidewalls 14, 15 of the radiative part 12. The movable plates 16 can be moved from the sidewalls 14, 15 into the interior of the radiative part 12, and vise versa. By moving the movable plates 16, the width of the radiative part 12 can be altered. Thus, the actual wavelength of the microwave propagating within this radiative part 12 can be controlled. Accordingly, the actual wavelength near the position of the slot antennas 13 can be also controlled.

Figure 4B:
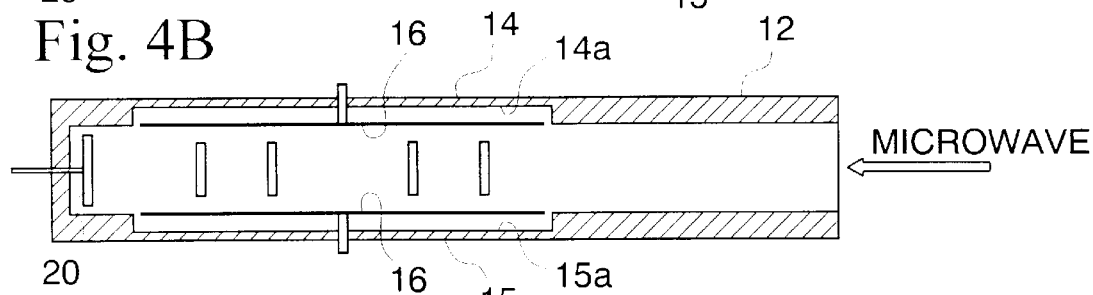

In the example shown in FIG. 4B, depressions 14a, 15a are formed in the sidewalls 14, 15, respectively. Again, movable plates 16 are provided on sidewalls 14, 15 of the radiative part 12. In this case, the movable plates 16 can be retracted into the depressions 14a, 15a, and can be projected into the interior of the radiative part 12, and vise versa. Similar to the case of FIG. 4A, by moving the movable plates 16, the width of the radiative part 12 can be altered, so that the actual wavelength of the microwave propagating within this radiative part 12 can be controlled and the actual wavelength near the position of the slot antennas 13 can be also controlled.

Figure 4C:
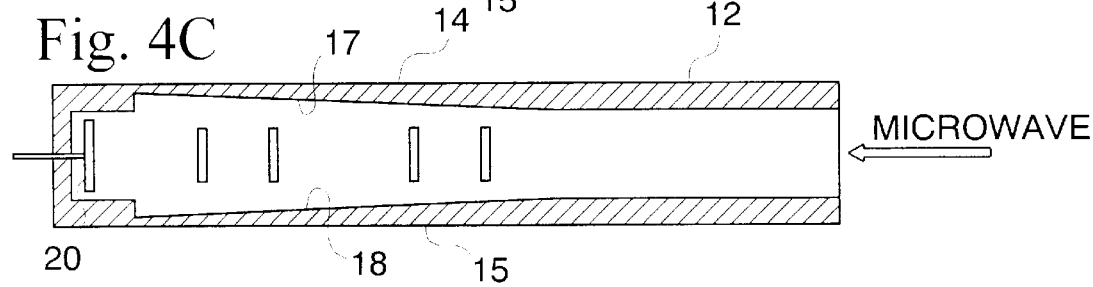
Figure 4D:
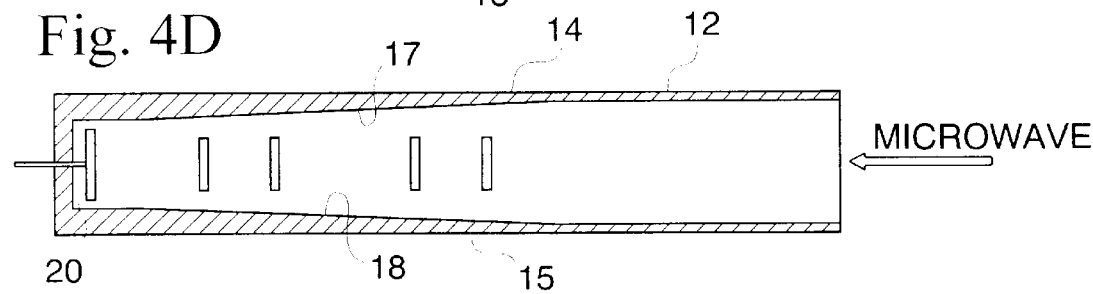

In the examples shown in FIGS. 4C and 4D, sidewalls 14, 15 of the radiative part 12 have the internal faces 17, 18, respectively. These internal faces 17, 18 provide a tapered shape which becomes wider/narrower as the microwave propagates distally. Due to this tapered shape, the width of the radiative part 12 is gradually widened/narrowed as the microwave propagates. Thus, the actual wavelength of the microwave propagating within this radiative part 12 will be changed locally. Accordingly, the actual wavelength near the position of the slot antennas 13 will also be changed locally.

It is noted that the internal faces 17, 18 having the above structure are obtainable either by making the thickness of the sidewalls gradually thinner as shown in FIG. 4C, or by making the thickness of the sidewalls gradually thicker as shown in FIG. 4D. Alternatively, although not shown, the sidewalls 14, 15 may be formed from a double wall construction.

Figure 4E:
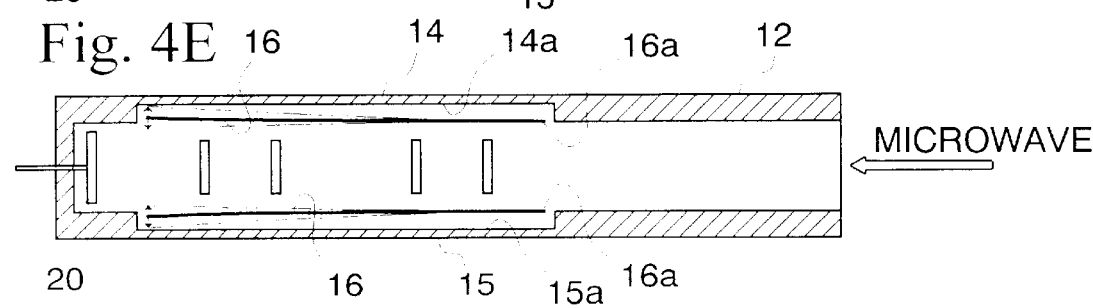

In the example shown in FIG. 4E, similar to the case of FIG. 4B, depressions 14a, 15a are formed in the sidewalls 14, 15, respectively. Movable plates 16 are provided on sidewalls 14, 15 of the radiative part 12. In this case, the movable plates 16 can be swung about one end 16a, which acts as a fulcrum, both toward the retracting direction into the depressions 14a, 15a and toward the projecting direction into the interior of the radiative part 12, and vise versa. In this case, by swinging the movable plates 16, the width of the radiative part 12 can be altered. Thus, the actual wavelength of the microwave propagating within this radiative part 12 can be controlled, and the actual wavelength near the position of the slot antennas 13 can be also controlled.

In any example shown in FIGS. 4A–4E, a plunger 20 made of a electric conductive plate is provided at the end of the radiative part 12. The plunger 20 is slidable with respect to the propagation direction of the microwave within the radiative part 12. In use, the electric potential of the plunger 20 is maintained to be equal to the electric potential of the walls of the radiative part 12.

Returning to FIG. 3, the construction of the plasma generating chamber 30 is explained.

The plasma generation chamber 30 mainly comprises a window 31 made of dielectric material, a support 32, a gas inlet 33, a gas outlet 34, and an evacuating system (not shown).

To the plasma generation chamber 30, for example, onto the top face thereof, the radiative part 12 is connected via the dielectric window 31.

The dielectric window 31 provides permeability for the microwave without loss. The window 31 allows electromagnetic radiation from the slot antennas 13 into the plasma generating chamber 30.

The support 32 is a means for supporting an article to be processed (not shown), and is disposed in the plasma generating chamber 30 with the top surface thereof opposed to the window 31. The support 32 is connected to the wall of the plasma generating chamber 30 in an electrically insulating manner due to the insertion of an electrically insulating material 32a between the support and the walls of the chamber. Also, to the support 32, high frequency AC voltage source 32b is electrically connected. The AC voltage source 32b can apply the high frequency voltage to the support 32. As is easily understood, a high frequency AC voltage source can be replaced with a low frequency AC voltage source, or to a DC voltage source.

Although, in the example illustrated, the support 32 forms a part of the bottom surface of the plasma generating chamber 30, the present invention is not limited to this specific construction. For example, the construction, in which the support 32 is formed as an independent member with the bottom surface, is conceivable.

The support 32 may comprise a mechanism for controlling the temperature of the article to be processed. The temperature controlling mechanism may comprise an adsorbing mechanism using an electrostatic field (a so-called, electrostatic chuck) and/or a mechanism for flowing/accumulating the heat conductive gas between the support 32 and an article to be processed. For example, using such a temperature controlling mechanism, the article to be processed (not shown) may be maintained at low temperature.

The gas inlet 33 allows the gas introduction into the plasma generating chamber 30.

The gas outlet 34 is connected to the evacuation system (not shown), so that, by appropriately regulating the evacuation system, the pressure control of the plasma generating chamber 30, such as the evacuation of the chamber or the keeping of the chamber at a desired level of vacuum, is provided.

[First Operating Method of the First Embodiment of the Plasma Processing Apparatus]

Next, a first example of an operating method of the first embodiment of the plasma processing apparatus is explained.

Figure 1B:
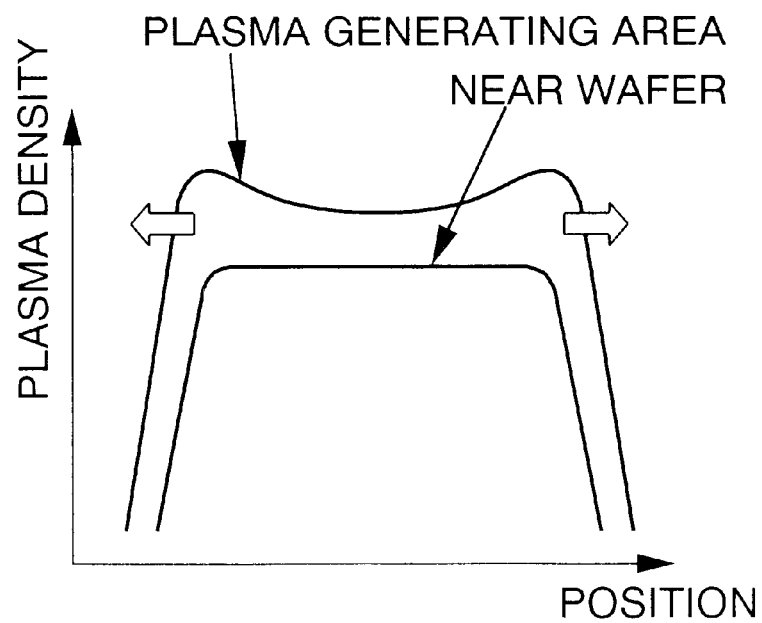
Figure 2A:
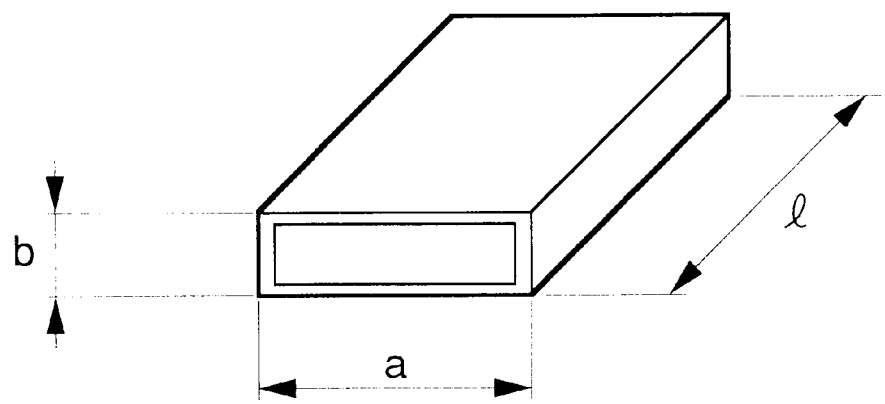
FIG. 2A is a perspective view showing a part of one example of the rectangular wave guide.
Figure 2B:
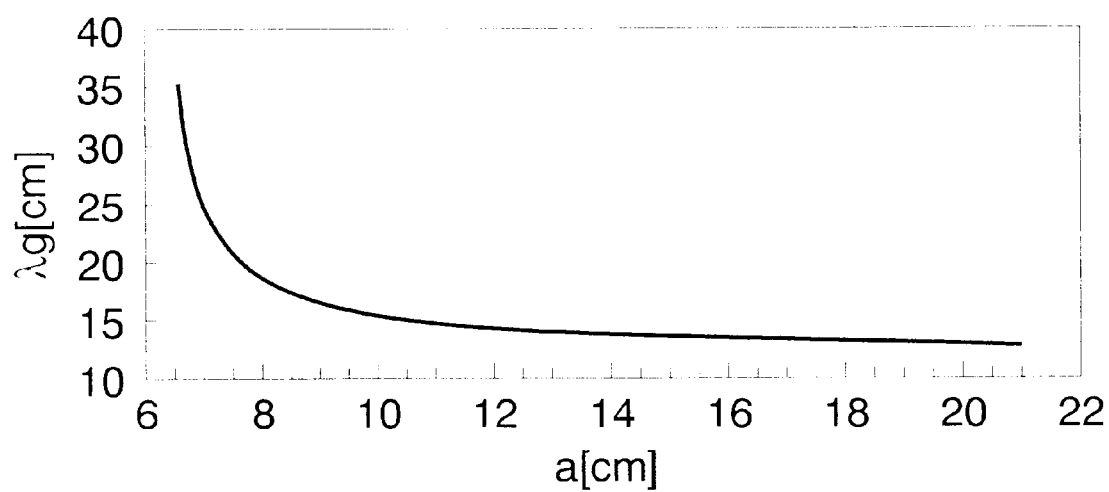
FIG. 2B is a graph showing the dependence of the actual wavelength ($\lambda_g$) within the rectangular wave guide shown in FIG. 2A with the width (a) of the rectangular wave guide.

Firstly, it is assumed that the ideal initial plasma distribution (for example, the raised-shoulder shape plasma distribution as shown in FIG. 1B) which will cause the uniform plasma distribution at the neighborhood of an article to be processed (not shown, typically, a wafer) has been determined, and that the slot antennas have been formed at the distribution corresponding to the initial plasma distribution already determined.

In the present invention, irrespective of conventional restriction that the slot antenna must be located at an interval of half of a wavelength, the distances between the neighboring slot antennas can be optionally set at a significantly large flexibility. This is an important feature of the present invention.

When a plasma is generated, the width of the radiative part 12 is appropriately altered depending on the respective constructions illustrated in FIGS. 4A–4E (The alternation of the width may be of either a variable type such as shown in FIG. 4A, 4B, or 4E; or a non-variable type such as shown in FIG. 4C or 4D).

Thereby, the actual wavelength is locally changed, so that the highest amplitude spots can be shifted to the positions of the slot antennas 13, thereby the required initial plasma distribution can be obtained and simultaneously the radiation amplitude from each of slot antennas 13 can be maximized.

In the first embodiment of the plasma processing apparatus, since the total edge length of each slot is substantially equal to the ideal wavelength of the microwave in free space, assuming that the shape of the slot is rectangular and that the width of the slot is sufficiently short, the length of the slot will be equal to half of the ideal wavelength, thereby the radiation efficiency from the slot antenna 13 is maximized.

Also in this first embodiment, since each slot is disposed with its longitudinal direction being oriented at a right angle with respect to the propagation direction of the microwave, effective radiation from each slot will be expected. In the case that each slot is disposed with its longitudinal direction being oriented at a predetermined angle other than a right angle, similar results will be expected.

Although, in the embodiment above, the width of the radiative part 12 is adjustable, even if the height of the radiative part 12 is adjustable, the same results will be expected.

Although, in the embodiment above, the radiative part 12 is formed as a rectangular shape wave guide, the radiative part 12 may be formed as any shape wave guide. Then, one or more dimensions (width, height, or, internal diameter, etc.) of the wave guide will be changeable near the slot antennas.

Since the dimension of the radiative part 12 is gradually changed (i.e., not abruptly changed), the electromagnetic loss due to the dimensional change, such as reflection due to the abrupt dimensional change, will be minimized.

Also, since the plunger 20 is provided at the end of the radiative part 12, fine adjustment of the microwave propagation conditions is possible.

In the plasma thus generated, there are a number of activated radicals which are electrically neutral, and a number of activated ions which are electrically positive. By applying high frequency AC voltage, low frequency AC voltage, or DC voltage to the support 32, only the activated ions can be selectively reacted with the article to be processed. Thus, it is possible to perform anisotropic etching, anisotropic ashing, and anisotropic deposition.

In this case, if the temperature control mechanism for maintaining the article at a low temperature is provided, reactivity of the neutral radicals is reduced, thereby anisotropy in the etching, the ashing, or the deposition are increased.

[Second Operating Method of the First Embodiment of the Plasma Processing Apparatus]

Next, a second example of an operating method of the first embodiment of the plasma processing apparatus is explained.

Recently, in the manufacturing process of semiconductor devices or flat panel displays such as liquid crystal displays, the circuitry formed on the substrate is required to be on a fine scale and/or to be thin with a view to higher integration. Also, a tendency to use a variety of materials is accelerated with a view to fast operation and/or low power operation. Since the circuitry formed on the substrate becomes more complex, processing methods become complex. So, it is increasingly desired to perform several processes sequentially.

If the plasma processing conditions, such as process gas and pressure, are altered during plasma processing, the diffusion feature of the plasma will be changed, and thus the plasma distribution will be changed. This second example of the operating method is particularly suited for such a circumstance. That is, according to this second example, even if the plasma processing conditions, such as process gas and pressure, are abruptly altered during plasma processing, it can quickly make uniform the plasma distribution near the substrate.

Figure 5A:
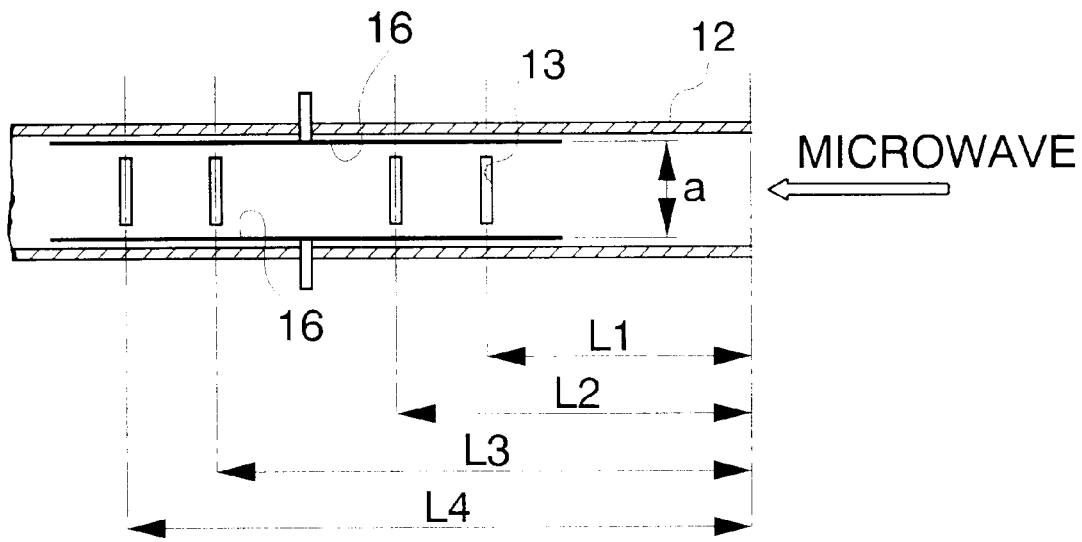
FIG. 5A is a cross-sectional view illustrating the location of slot antennas.

Now, this second operating method will be explained for the construction shown in FIG. 4A. It is assumed that four slot antennas 13 are located at distances L1, L2, L3, and L4 measured from the standard point within the radiative part 12 as shown in FIG. 5A. In this case, these positions of the slot antennas 13 are assumed to be selected in such a way that, in a first processing condition, the uniform plasma distribution is established near the substrate due to the electromagnetic radiation mainly from the slot antennas located at L1 and L3, and that in a second processing condition, which is different from the first processing condition, another uniform plasma distribution is established near the substrate due to the electromagnetic radiation mainly from the slot antenna located at L2 and L4.

Figure 5B:
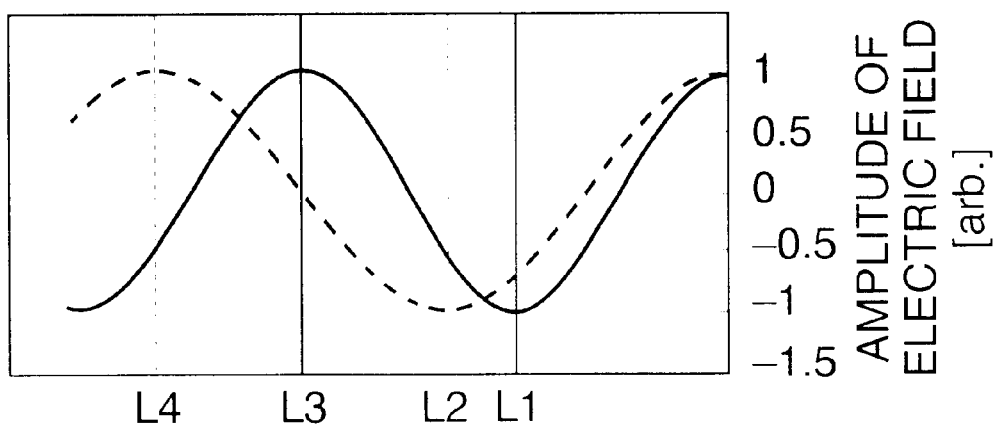
FIG. 5B is a view showing the amplitude of electric field with regards to two examples of width (a1 and a2).

When a plasma processing is made under the first processing condition, the distance between the movable plates 16 is set at a1 such that the electromagnetic radiation from the slot antenna located at L1 and L3 is maximized (see FIG. 5B).

Even if the plasma processing condition is abruptly switched from the first processing condition to the second processing condition, by switching the distance between the movable plates 16 from the distance a1 to distance a2 in which the electromagnetic radiation from the slot antenna located at L2 and L4 is maximized, the quick switching to the second processing condition can be easily made. Preferably, in each processing condition, both the contribution from strongly radiating slots and the contribution from weakly radiating slots are considered.

[Second Embodiment of the Plasma Processing Apparatus]

Figure 6:
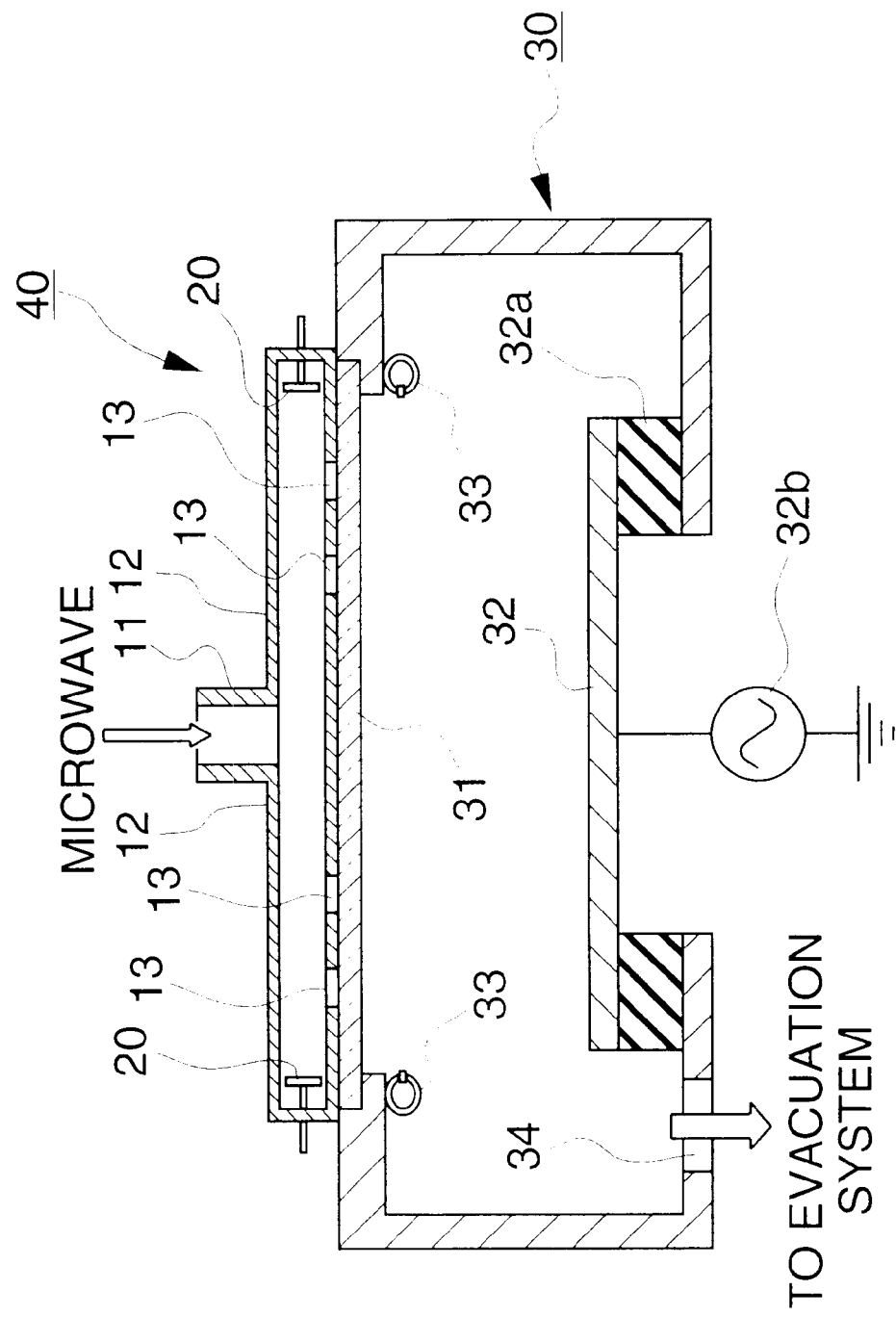
FIG. 6 is a cross-sectional view showing the plasma processing apparatus according to the second embodiment of the present invention.

FIG. 6 illustrates the plasma processing apparatus according to the second embodiment proposed by the present invention. In this second embodiment, the construction of the plasma generating device 40 is different from that of the plasma generating device 10 in the first embodiment. The construction of the plasma generating chamber 30 in this second embodiment is the same as that in the first embodiment. Thus, further description of the chamber is omitted.

Figure 7A:
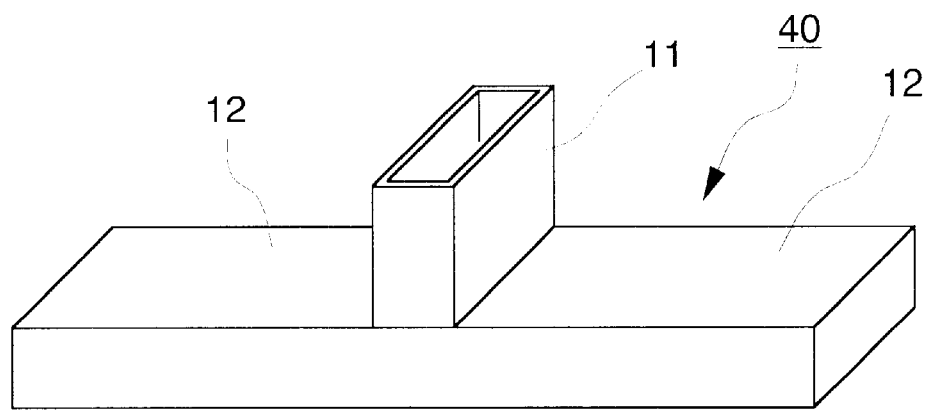
FIG. 7A is a perspective view showing one example of a plasma generating device used in the plasma processing apparatus according to the second embodiment.

FIG. 7A is a perspective view showing the plasma generating device 40 used in the plasma processing apparatus according to the second embodiment. In the example shown in FIG. 7A, the plasma generating device 40 comprises one wave guide 11 and two radiative parts 12.

Figure 7B:
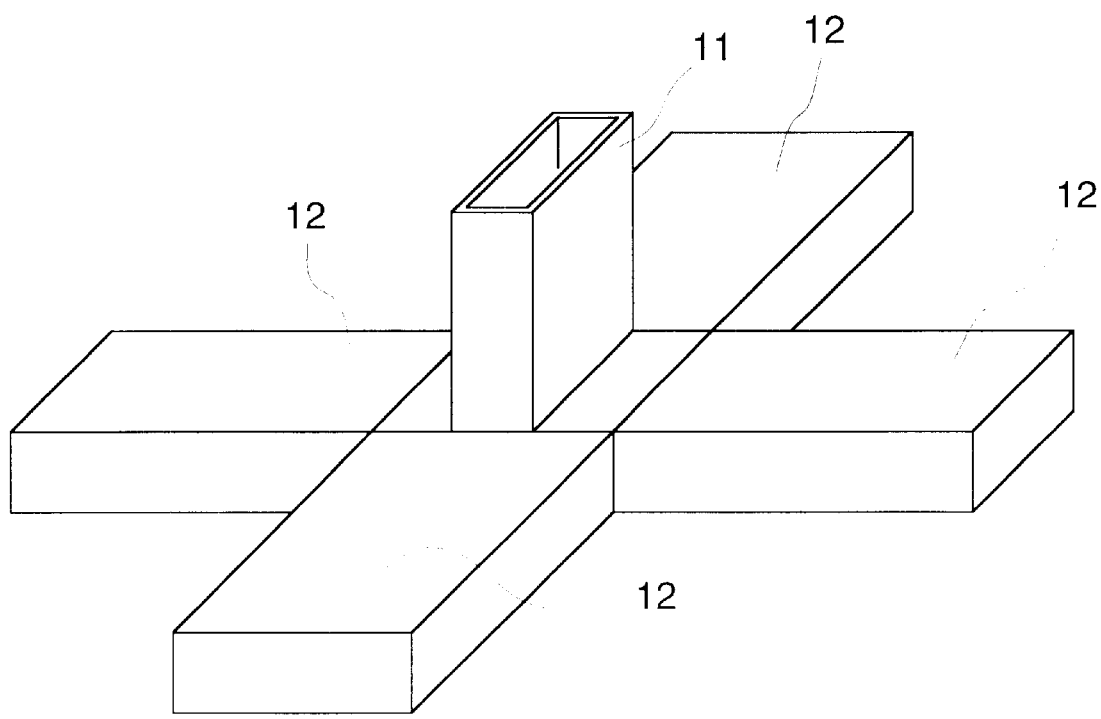
FIG. 7B is a perspective view showing a variant of the plasma generating device of FIG. 7A.
Figure 8A:
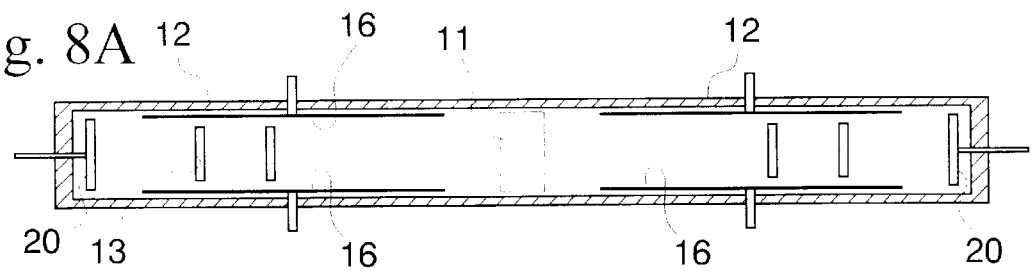
FIGS. 8A–8E are cross-sectional views showing several alternative constructions for the radiative part used in the plasma processing apparatus shown in FIG. 6.
Figure 8B:
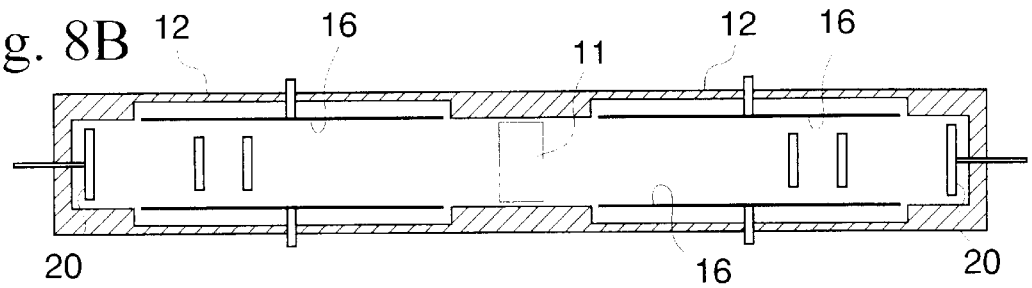
Figure 8C:
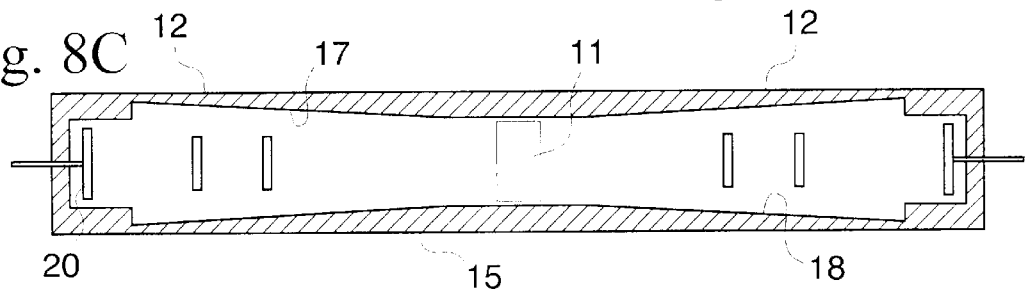
Figure 8D:
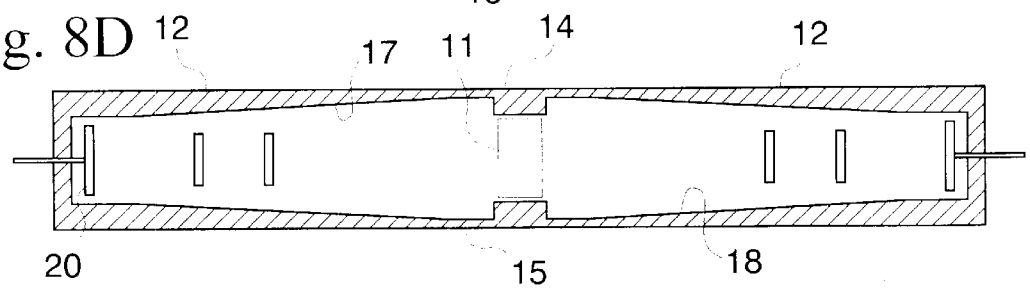
Figure 8E:
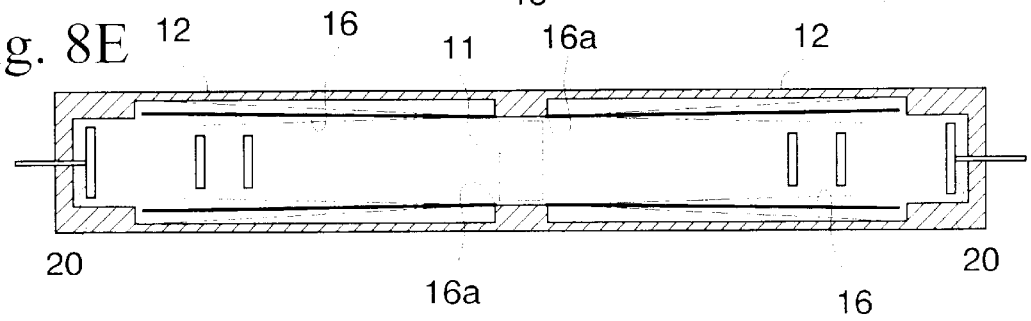

As a variant, as shown in FIG. 7B, four radiative parts 12 may be connected to one wave guide 11. As is easily understood, another number of radiative parts 12 may be connected to one wave guide 11.

The constructions of the radiative parts 12 are illustrated in FIGS. 8A–8E. These illustrations correspond to those in FIGS. 4A–4E. The constructions in FIGS. 8A–8E are obtainable by connecting two constructions in mirror-image.

The advantage of this second embodiment is similar to that of the first embodiment. However, in the second embodiment, the uniform plasma distribution can be established across a relatively large area.

In this second embodiment, since the wave guide 11 and the radiative parts 12 intersect each other at a right angle, it is preferable to provide any known means for preventing the reflection of microwaves at the intersecting area.

From the foregoing description, it will understand that, according to the present invention, even if slot antennas are located at any distribution, by altering one or more dimensions of the radiative part, the actual wavelength within the radiative part can be changed, so that the amplitude of the microwave at the positions of the slot antennas can be adjusted, thereby required initial plasma distribution, which will cause uniform plasma distribution near the substrate, can be obtained.

What is claimed is:

1. A plasma generating device comprising:
   a wave guide for propagation of a microwave from a microwave oscillating source;
   a radiative part, defined by having a width, a height and a longitudinal dimension, substantially perpendicular to the width and height, along which microwaves are propagated, the radiative part being connected to said wave guide for receiving microwaves therefrom and having a plurality of slot antennas disposed along the longitudinal dimension, each of said slot antennas being adapted to radiate electromagnetic radiation corresponding to the microwave existing at respective locations of slot antennas; and
   a plasma generation chamber being connected to said radiative part via a window made of a dielectric material and being adapted to receive the electromagnetic radiation from said slot antennas;
   wherein at least one of the width and height of the radiative part is adapted to be locally changeable by a movable member, so that the actual wavelength of the microwave within said radiative part is allowed to be locally changed, thereby the amplitude distribution of the electromagnetic radiation being radiated from said slot antennas towards said plasma generation chamber can be controlled.

2. The plasma generating device according to claim 1, wherein the frequency of the microwave is in the range of between 1 GHz and 50 GHz.

3. The plasma generating device according to claim 1, wherein each slot antenna defines a slot, and wherein the total edge length of each slot is substantially equal to the ideal wavelength of the microwave in free space.

4. The plasma generating device according to claim 1, wherein each slot antenna defines a slot, and wherein each slot is disposed with its longitudinal direction being oriented at a predetermined angle with respect to the propagation direction of the microwave within the radiative part.

5. The plasma generating device according to claim 1, wherein each slot antenna defines a slot, and wherein each slot is disposed with its longitudinal direction being oriented at a right angle with respect to the propagation direction of the microwave within the radiative part.

6. The plasma generating device according to claim 1, wherein the shape of the radiative part is rectangular, and wherein the width of the radiative part near the slot antennas is changeable.

7. The plasma generating device according to claim 1, wherein either the height or the width of the radiative part is gradually changed.

8. The plasma generating device according to claim 7, wherein the shape of the radiative part is rectangular, and wherein the width of the radiative part near the slot antennas is gradually changed.

9. The plasma generating device according to claim 7, wherein either the height or the width of the radiative part is gradually changed, and wherein the changing rate thereof is changeable.

10. The plasma generating device according to claim 9, wherein the shape of the radiative part is rectangular, wherein the width of the radiative part near the slot antennas is gradually changed, and wherein the changing rate thereof is changeable.

11. The plasma generating device according to claim 1, wherein a plunger made of an electrically conductive plate is provided at the end of the radiative part so as to be slidable with respect to the propagation direction of the microwave within the radiative part, and wherein the electric potential of the plunger is maintained to be equal to the electric potential of the radiative part.

12. A plasma processing apparatus comprising the plasma generating device according to claim 1.

13. The plasma processing apparatus according to claim 12, wherein a support for an article to be processed is disposed in the plasma generating chamber with one surface of the support opposite to the window, and wherein the support is adapted to receive AC voltage.

14. The plasma processing apparatus according to claim 12, wherein a support for an article to be processed is disposed in the plasma generating chamber with one surface of the support opposite to the window, and wherein the support is adapted to receive DC voltage.

15. The plasma processing apparatus according to claim 12, wherein a support for an article to be processed is disposed in the plasma generating chamber with one surface of the support opposite to the window, and wherein the support is provided with a mechanism for controlling the temperature of the article to be processed.

* * * * *